(12) United States Patent
Voutilainen et al.

(10) Patent No.: US 9,024,300 B2
(45) Date of Patent: May 5, 2015

(54) MANUFACTURE OF GRAPHENE-BASED APPARATUS

(75) Inventors: Martti Kalevi Voutilainen, Espoo (FI); Pirjo Pasanen, Helsinki (FI)

(73) Assignee: Nokia Corporation, Espoo (FI)

( * ) Notice: Subject to any disclaimer, the term of this patent is extended or adjusted under 35 U.S.C. 154(b) by 716 days.

(21) Appl. No.: 12/779,436

(22) Filed: May 13, 2010

(65) Prior Publication Data

US 2011/0278545 A1 Nov. 17, 2011

(51) Int. Cl.
*H01L 29/08* (2006.01)
*H01L 29/16* (2006.01)
*B32B 3/10* (2006.01)
*B32B 9/04* (2006.01)
*H01L 29/66* (2006.01)
*H01L 29/778* (2006.01)
*H01L 29/786* (2006.01)
*H01L 21/683* (2006.01)
*H01L 21/02* (2006.01)
*H01L 21/18* (2006.01)

(52) U.S. Cl.
CPC .............. *H01L 29/1606* (2013.01); *B32B 3/10* (2013.01); *B32B 9/04* (2013.01); *H01L 29/66742* (2013.01); *H01L 29/7781* (2013.01); *H01L 29/78645* (2013.01); *H01L 29/78648* (2013.01); *H01L 29/78684* (2013.01); *H01L 29/78696* (2013.01); *H01L 21/6835* (2013.01); *H01L 21/02527* (2013.01); *H01L 21/187* (2013.01); *B32B 2457/00* (2013.01); *H01L 2221/6835* (2013.01); *H01L 2221/68368* (2013.01)

(58) Field of Classification Search
CPC ................................................... H01L 29/1606
USPC ............. 257/40, E51.038, E21.049, E21.128, 257/E21.614; 977/755
See application file for complete search history.

(56) References Cited

U.S. PATENT DOCUMENTS

| | | | |
|---|---|---|---|
| 2007/0145367 A1* | 6/2007 | Chen et al. ...................... | 257/49 |
| 2009/0294759 A1 | 12/2009 | Woo et al. ........................ | 257/29 |
| 2010/0006823 A1 | 1/2010 | Anderson et al. ............... | 257/24 |
| 2010/0021708 A1 | 1/2010 | Kong et al. ..................... | 428/220 |
| 2010/0051897 A1 | 3/2010 | Chen et al. ........................ | 257/9 |
| 2010/0090759 A1 | 4/2010 | Shin et al. ..................... | 327/581 |
| 2010/0323164 A1 | 12/2010 | Ogihara et al. ............... | 428/156 |
| 2011/0068320 A1* | 3/2011 | Marinero et al. .................. | 257/9 |

(Continued)

OTHER PUBLICATIONS

Iannaccone G et al, "Perspectives of Grapheme Nanoelectronics: Probing Technological Options with Modelling", Electron Devices Meeting (IEDM), (2009) IEEE International, (pp. 10.4.1-10.4.4).

(Continued)

*Primary Examiner* — Ha Tran T Nguyen
*Assistant Examiner* — Aaron Dehne
(74) *Attorney, Agent, or Firm* — Harrington & Smith

(57) ABSTRACT

An apparatus including: a stacked structure including a first substrate having a flat surface; a flat first graphene layer adjacent the flat surface of the first substrate; a flat second graphene layer adjacent the flat first graphene layer; and a second substrate having a flat surface adjacent the flat second graphene layer. An apparatus including: a stacked structure including a substrate having a flat upper surface; a flat lower patterned layer overlying the flat upper surface of the substrate and including at least one patterned electrode; a flat lower graphene layer overlying the flat lower patterned layer; a flat upper graphene layer overlying the flat lower graphene layer; and a flat upper patterned layer overlying the flat upper graphene layer and including at least one patterned electrode.

16 Claims, 3 Drawing Sheets

(56) References Cited

U.S. PATENT DOCUMENTS

Figure 1:
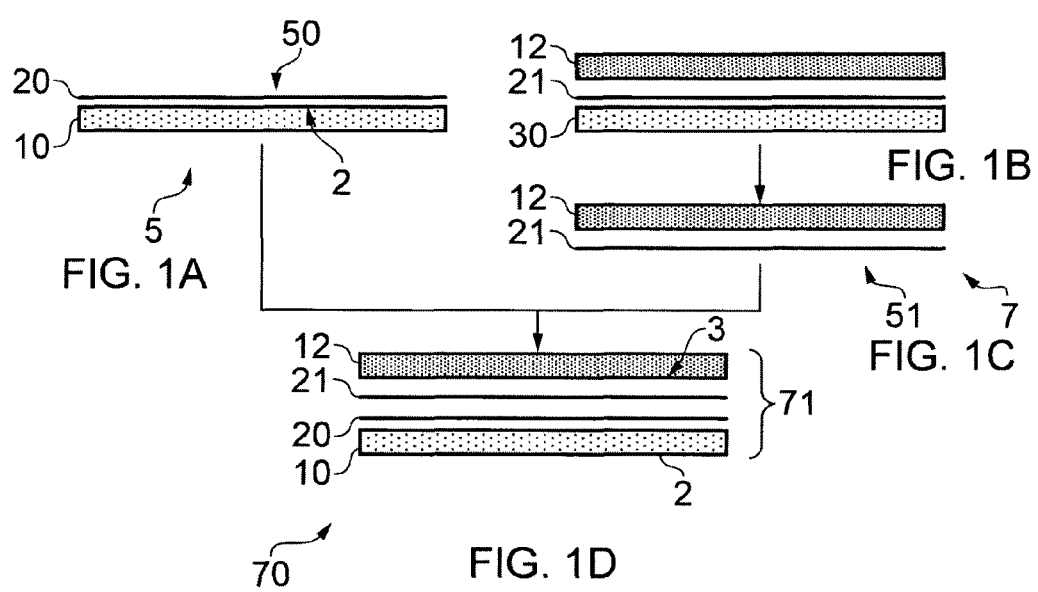

2011/0186817 A1* 8/2011 Bowers et al. .................. 257/29
2011/0215300 A1* 9/2011 Guo et al. ....................... 257/29

OTHER PUBLICATIONS

Plus C et al, "Planar Tunnel Junction Fabrication and Bandgap Engineering on Bilayer Grapheme", Device Research Conference, (2009), (p. 205-206).
Keun Soo Kim et al, "Large-Scale Pattern Growth of Grapheme Films for Stretchable Transparent Electrodes", Nature vol. 457, No. 7230, (2009), (pp. 706-710).
Xia, F. et al.; "Graphene field-effect-transistors with high on/off current ratio and large transport bandgap at room temperature"; Jan. 21, 2010; whole document (15 pages).
Sui, Y. et al.; "Screening and interlayer coupling in multilayer graphene field-effect transistors"; 2009; Nano Letters, vol. 9, No. 8; pp. 2973-2977.
Bae, S. et al.; "30 inch Roll-Based Production of High-Quality Graphene Films for Flexible Transparent Electrodes"; 2010; Nature Nanotech, Advance Online Publication; whole document (16 pages).
Sordan, R. et al.; "Logic gates with a single graphene transistor"; 2009; Applied Physics Letters 94; whole document (3 pages).
Farmer, D. et al.; "Utilization of a Buffered Dielectric to Achieve High Field-Effect Carrier Mobility in Graphene Transistors"; 2009; Nano Letters, vol. 9, No. 12; pp. 4474-4478.
Liu, C.H. et al.; "Stacking-dependent shear modes in trilayer graphene"; May 28, 2014; whole document (17 pages); arXiv: 1405.7343.
Liu, K. et al.; "Evolution of Interlayer Coupling in Twisted $MoS_2$ Bilayers"; Jun. 25, 2014; whole document (19 pages); arXiv: 1406.6487.
Moon, P. et al.; "Optical absorption of twisted bilayer graphene with interlayer potential asymmetry"; Aug. 20, 2014; whole document (11 pages); arXiv: 1408.4513.
Othman, M. et al.; "Graphene-dielectric composite metamaterials: evolution from elliptic to hyperbolic wavevector dispersion and the transverse epsilon-near-zero condition"; Jun. 24, 2013; whole document (16 pages); Journal of Nanophysics, vol. 7.
Othman, M. et al.; "Graphene-based tunable hyperbolic metamaterials and enhanced near-field absorption"; Mar. 20, 2013; whole document (19 pages); Optics Express, vol. 21, No. 6.
Fiori, Gianluca, et al., "On the Possibility of Tunable-Gap Bilayer Graphene FET", IEEE vol. 30, No. 3, 2009, pp. 261-264.
Cheli, Martina et al., "A Semianalytical Model of Bilayer-Graphene Field-Effect Transistor", IEEE vol. 56, No. 12, 2009, pp. 2979-2986.
Zhu, Bofeng et al., "Nanoscale dielectric-graphene-dielecdtric tunable infrared waveguide with ultrahigh refractive indices", Optics Express, Jul. 10, 2013, 8 pgs.
Kuan-l Ho, et al., "Fluorinated Graphene as High Performance Dielectric Materials and the Applications for Graphene Nanoelectronics", Scientific Reports, Jul. 31, 2014, pp. 1-7.

* cited by examiner

MANUFACTURE OF GRAPHENE-BASED APPARATUS

TECHNOLOGICAL FIELD

Embodiments of the present invention relate to manufacture of graphene-based apparatus. In particular, they relate to manufacture of graphene-based electronic devices or circuits and/or structures for the manufacture of graphene-based electronic devices or circuits.

BACKGROUND

Electronic devices and integrated circuits are extremely common. It is common practice to use silicon-based electronic devices and integrated circuits because the mass manufacturing techniques used for producing silicon-based electronic devices or circuits have been continuously developed over several decades.

Graphene has a potentially very high mobility when compared with silicon. It would therefore be desirable to mass produce electronic devices or integrated circuits that use graphene as an electric current channel rather than silicon. However, it is not possible to reuse the scalable mass manufacturing techniques used for mass producing silicon-based electronic devices or circuits to mass produce graphene-based electronic devices or circuits.

BRIEF SUMMARY

According to various, but not necessarily all, embodiments of the invention there is provided an apparatus comprising:
a stacked structure comprising:
 a first substrate having a flat surface;
 a flat first graphene layer adjacent the flat surface of the first substrate;
 a flat second graphene layer adjacent the flat first graphene layer; and
 a second substrate having a flat surface adjacent the flat second graphene layer.

According to various, but not necessarily all, embodiments of the invention there is provided a method comprising:
forming a first component comprising a first graphene layer on a first substrate;
forming a second component by
 forming a second graphene layer on a sacrificial substrate;
 forming a second substrate over the second graphene layer; and
 removing the sacrificial substrate; and
joining the first component and the second component so that the first substrate and the second substrate are on opposite exterior surfaces of the resultant structure.

According to various, but not necessarily all, embodiments of the invention there is provided an apparatus comprising:
a stacked structure comprising:
 a substrate having a flat upper surface;
 a flat lower patterned layer overlying the flat upper surface of the substrate and comprising at least one patterned electrode;
 a flat lower graphene layer overlying the flat lower patterned layer;
 a flat upper graphene layer overlying the flat lower graphene layer; and
 a flat upper patterned layer overlying the flat upper graphene layer and comprising at least one patterned electrode.

According to various, but not necessarily all, embodiments of the invention there is provided a method comprising:
removing a first substrate to expose a first graphene layer from a stacked structure comprising:
 a first substrate;
 first and second graphene layers, wherein the first graphene layer is adjacent the first substrate; and
 a second substrate adjacent the second graphene layer;
forming a first patterned layer adjacent the first graphene layer;
providing a third substrate adjacent the first patterned layer;
removing the second substrate;
forming a second patterned layer adjacent the second graphene layer.

BRIEF DESCRIPTION

Figure 3:
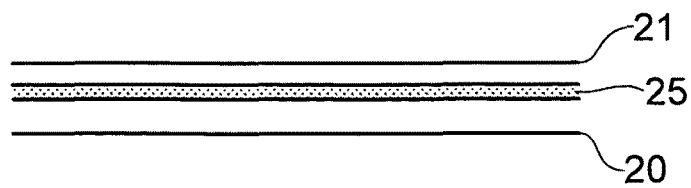
Figure 4:
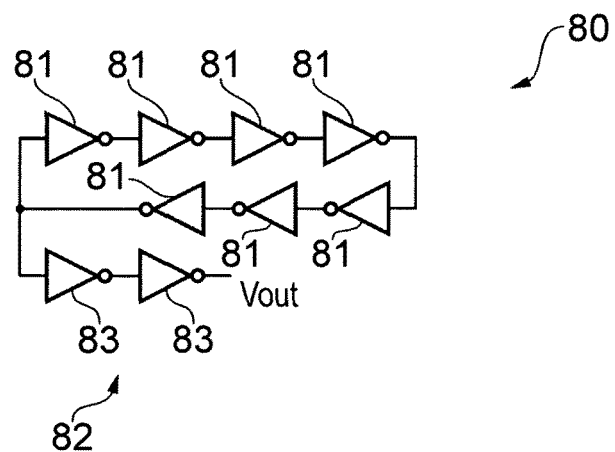

For a better understanding of various examples of embodiments of the present invention reference will now be made by way of example only to the accompanying drawings in which:

FIGS. 1A to 1D schematically illustrate operations in manufacturing an apparatus which may be an intermediate structure in the manufacture of an electronic apparatus or integrated circuit;

FIGS. 2A to 2E schematically illustrate operations in manufacturing the electronic apparatus starting from the intermediate structure;

FIG. 3 schematically illustrates an example embodiment where a dielectric layer intervenes between the first graphene layer and the second graphene layer;

FIG. 4 schematically illustrates an example of a ring oscillator; and

Figure 5:
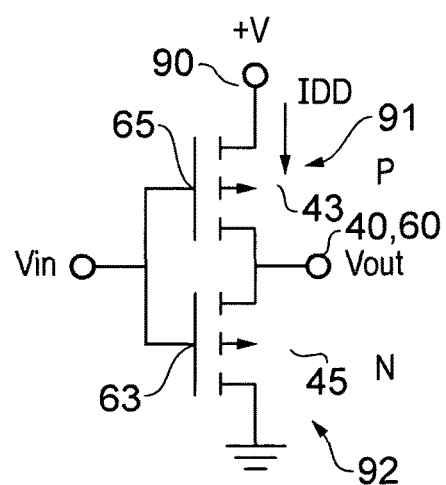

FIG. 5 schematically illustrates an example of an inverter.

DETAILED DESCRIPTION

Figure 2:
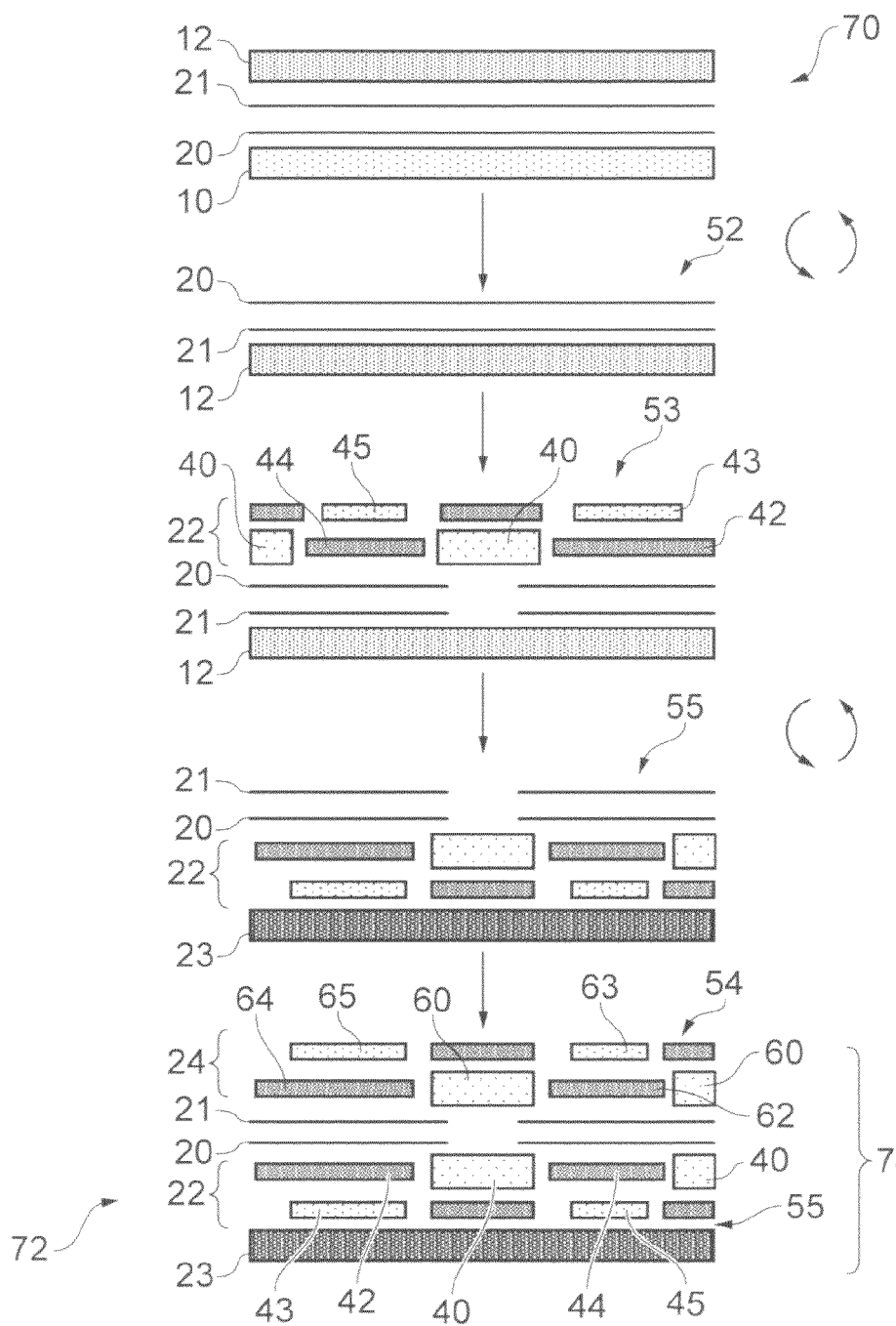

FIGS. 1A, 1B, 1C and 1D schematically illustrate operations in manufacturing an apparatus 70 which is an intermediate structure in the manufacture of an electronic apparatus 72 (FIG. 2E). The electronic apparatus 72 may be an integrated circuit.

FIG. 1A illustrates forming a first component 5 comprising a first graphene layer 20 on a first substrate 10. The first substrate 10 is a sacrificial substrate used for the formation of the first graphene layer 20. The first substrate 10 is present in the final structure of the apparatus 70 but is subsequently removed during manufacture of the electronic apparatus 72 (FIG. 2B). The first substrate 10 may, for example, be any suitable substrate on which graphene can be formed. It may be a crystal or molecular structure. It may be a metal such as a copper foil, or nickel foil or iridium foil.

The first graphene layer 20 may be a monolayer or consist of a few graphene layers. The first graphene layer 20 may be undoped or, alternatively, it may be doped with a p-type or n-type dopant. The doping can be also done in "patterns", where some parts of the first graphene layer 20 are doped p-type and other parts n-type. The first graphene layer 20 has as exposed flat surface 50.

FIGS. 1B and 1C illustrate forming a second component 7 comprising a second graphene layer 21 on a second substrate 12.

At FIG. 1B, a second graphene layer 21 is formed on a sacrificial substrate 30. Then a second substrate 12 is formed over the second graphene layer 21.

The sacrificial substrate 30 is used for the formation of the second graphene layer 21 and will be subsequently removed during manufacture of the apparatus 70 (FIG. 1C). The sacrificial substrate 30 may, for example, be any suitable substrate on which graphene can be formed. It may be a crystal or molecular structure. It may be a metal such as a copper foil, or nickel foil or iridium foil.

The second graphene layer 21 may be a monolayer or consist of a few graphene layers. The second graphene layer may be undoped or, alternatively, it may be doped with a p-type or n-type dopant. The doping can be also done in "patterns", where some parts of the second graphene layer 21 are doped p-type and other parts n-type.

The second substrate 12 is a transfer substrate which is present in the final structure of the apparatus 70. It is subsequently used during manufacture of the electronic apparatus 72 (FIG. 2D) for the flip transfer of at least the combination of at least the first and second graphene layers to a third substrate 23 and is then removed. The second substrate 12 may be a removable support polymer.

At FIG. 1C, the sacrificial substrate 30 is removed to form the second component 7 exposing a flat surface 51 of the second graphene layer 21. For example, if the sacrificial substrate 30 is copper it is removed by etching.

At FIG. 1D, the first component 5 and the second component 7 are joined so that the first substrate 10 and the second substrate 12 are on opposite exterior surfaces of the resultant structure 70. The first graphene layer 20 of the first component 5 and the second graphene layer 21 of the second component part 7 are brought into contact and pressed together. The graphene layers adhere as a result of Van der Waals forces. Adhesion between the layers may be improved using a drop of acetone or other liquid on the graphene layers and letting it dry before joining them. Heating and cooling may be used to improve adhesion.

In the illustrated example, the first graphene layer 20 directly contacts the second graphene layer 21. However, in other embodiments a dielectric layer 25 may intervene between the first graphene layer 20 and the second graphene layer 21 as illustrated in FIG. 3.

As the first graphene layer 20 is formed independently of the second graphene layer 21 the layers may have an arbitrary stacking order. A specific stacking order between the graphene layers is optional and is not required. The lattices for the first graphene layer 20 and the second graphene layer 21 may be rotated and shifted with a random angle and shift, which are not necessarily the ones found in graphitic multi-layers The illustrated resultant apparatus 70 is a stacked structure 71 comprising: a first substrate 10 having a flat surface 2; a flat first graphene layer 20 adjacent and contacting the flat surface 2 of the first substrate 10; a flat second graphene layer 21 adjacent (and optionally contacting) the flat first graphene layer 20; and a second substrate 12 having a flat surface 3 adjacent and contacting the flat second graphene layer 21.

The flat layers and the planar interfaces between the layers are artifacts of the manufacturing process.

FIGS. 2A to 2E schematically illustrate operations in manufacturing an electronic apparatus 72 using the apparatus 70 as a starting structure as illustrated in FIG. 2A. In this example the apparatus 72 is an integrated transistor device.

The apparatus 70 illustrated in FIG. 2A is the same as that illustrated in FIG. 1D. It is an ordered stacked structure 71 comprising, in order: a first substrate 10; a flat first graphene layer 20; a second graphene layer 21; and a second substrate 12.

FIG. 2B illustrates removing the first substrate 10 to expose the first graphene layer 20 that has a flat surface 52. If the first substrate is copper it may be removed by etching.

FIG. 2C illustrates forming a flat first patterned layer 22 adjacent and in contact with the first graphene layer 20.

The first patterned layer 22 comprises patterned gate electrodes 43, 45 associated with the first graphene layer 20, respective dielectric layers 42, 44 between the patterned gate electrodes 43, 45 and the first graphene layer 20, and source/drain electrodes 40.

The graphene layers 20, 21 may be patterned before selective deposition of dielectric to form gate dielectrics 42, 44 and the selective deposition of conductive material to form bottom gate electrodes 43, 45 and source/drain electrodes 40.

The patterned bottom gate electrodes 43, 45 are local to one electronic device (conductive channel) each and are not common to or shared between all integrated electronic devices/channels.

The first patterned layer 22 is a planar layer having a flat surface adjacent the flat surface 52 of the first graphene layer 20 and a flat exposed surface 53.

FIG. 2D illustrates that next a third substrate 23 is provided adjacent and in contact with the first patterned layer 22. Then the structure is flipped so that the third substrate 23 becomes a supporting base. Then the second substrate 12 is removed exposing a flat surface 55 of the second graphene layer 21.

FIG. 2E illustrates forming a flat second patterned layer 24 adjacent and in contact with the second graphene layer 21.

The second patterned layer 24 comprises patterned gate electrodes 63, 65 associated with the second graphene layer 21, respective dielectric layers 62, 64 between the patterned gate electrodes 63, 65 and the second graphene layer 21, and source/drain electrodes 60. The electrodes, gates and dielectric layers may or may not be the same shape and in the same position as in the first patterned layer 22.

Selective deposition of dielectric may be used to form gate dielectrics 62, 64 and selective deposition of conductive material may be used to form top gate electrodes 63, 65 and source/drain electrodes 60. The gate dielectrics 62, 64 may be less than 10 nm thick. They may be thinner and/or may have a higher dielectric constant than the gate dielectrics 42, 44 of the bottom gate electrodes or they may be similar to the gate dielectrics 42, 44 to maintain symmetry between the top transistors and bottom transistors.

The patterned top gate electrodes 63, 65 are local to one or more integrated electronic devices (channels) each but are not typically common to or shared between all integrated electronic devices (channels).

The second patterned layer 24 is a planar layer in this example having a flat surface adjacent the flat surface 55 of the second graphene layer 21 and a flat exposed surface 54.

The resultant structure is an apparatus 72 comprising: an ordered stacked structure 74 comprising, in order:
- a substrate 23 having a flat upper surface 55;
- a flat lower patterned layer 22 overlying the flat upper surface 55 of the substrate 23 and comprising at least one patterned electrode 40, 43, 45;
- a flat lower graphene layer 20 overlying the flat lower patterned layer 22;
- a flat upper graphene layer 21 overlying the flat lower graphene layer 20; and
- a flat upper patterned layer 24 overlying the flat upper graphene layer 21 and comprising at least one patterned electrode 60, 63, 65.

The flat layers and the planar interfaces between the layers are artifacts of the manufacturing process.

In some embodiments, the graphene layers may be etched through so that in the final structure at least some of the source/drain electrodes 60 make galvanic contact with at least some of the underlying source/drain electrodes 40. That is there are source/drain electrodes that are common to the lower patterned layer 22 and the upper patterned layer 24.

The structure 72 can be used as a first field effect device, which has two parallel channels 20, 21 controlled by applying a voltage to the gates 45, 63, in series with a second field effect device, which has two parallel channels 20, 21 controlled by applying a voltage to the gates 43, 65.

The gates 63, 65, 43, 45 may be configured for independent control. Alternatively they may be configured for dependent control.

For example, the gates 63, 45 may be interconnected so that the same input voltage Vin is applied to both gates. In this example, the graphene layers may be doped differently (intra-layer differential doping). The upper channel provided by the second graphene layer 21 may be doped to opposite type (n- or p . . . ) than the lower channel provided by the first graphene layer 20.

For example, the gates 63, 45 may be interconnected so that the opposite input voltages are applied to both gates. In this example, he graphene layers may be doped similarly: the upper channel provided by the second graphene layer 21 may be doped to similar type (n- or p . . . ) as the lower channel provided by the first graphene layer 20.

The first field effect device and the second field effect device may be configured for antagonistic inverter operation. In this configuration, the doping of the first graphene layer 20 changes between the first device and the second device and the doping of the second graphene layer 21 changes between the first device and the second device (inter-layer differential doping).

The gates 63, 65, may be interconnected so that the same input voltage Vin is applied to both gates 63, 65.

The gates 43, 45, may be interconnected so that the same input voltage is applied to both gates 63, 65, which is the same input voltage Vin if the first and second graphene layers are similarly doped and different if the first and second layers are oppositely doped.

FIG. 5 schematically illustrates an example of an inverter 81. The inverter comprises a series combination of a first transistor 91 and a second transistor 92. The first and second transistors may be formed as described with reference to FIGS. 1A-1D and 2A-2E as an integrated circuit with a common substrate 23.

In this example, the top gates 63, 65 are interconnected so that a common input voltage Vin is applied to both top gates.

In this example, the first transistor 91 is configured to operate as an on/off transistor and the second transistor 92 is configured to operate as an off/on transistor. When the input voltage is at V1, the first transistor 91 is on and the second transistor 92 is off. When the input voltage is at V2, the first transistor 91 is off and the second transistor 92 is on. The antagonistic operation of the first transistor 91 and the second transistor 92 may, for example, be achieved by using differential channel doping between the first transistor 91 and the second transistor 92 which may affect one or more of the graphene layers 20, 21 and/or by applying different voltages to the back gate electrodes 43, 45.

FIG. 4 schematically illustrates an example of a ring oscillator comprising multiple inverters. In this example seven inverters 81 are connected in series in a loop. The output of each inverter 81 is provided as an input to the next inverter in the series. The output of the last inverter in the series is not only provided as an input to the first inverter 81 in the series but is also provided as an output signal to a buffer 82 comprising two series connected inverters 82.

The series of inverters 81 may be integrated in a single circuit so that they share a common substrate 23.

The apparatus 72 is a module. As used here 'module' refers to a unit or apparatus that excludes certain parts/components that would be added by an end manufacturer or a user.

The blocks illustrated in the Figs may represent operations in a method. The illustration of a particular order to the blocks does not necessarily imply that there is a required or preferred order for the blocks and the order and arrangement of the block may be varied. Furthermore, it may be possible for some operations to be omitted.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
   a stacked structure comprising:
   a first substrate having a flat surface;
   a flat first graphene layer adjacent the flat surface of the first substrate;
   a flat second graphene layer, formed independently of the flat first graphene layer, and positioned in direct contact with the flat first graphene layer; and
   a second substrate having a flat surface adjacent the flat second graphene layer;
   wherein the first and second graphene layers are rotated with respect to each other by an angle that is not a multiple of 60 degrees.

2. An apparatus as claimed in claim 1, wherein the first substrate is a sacrificial substrate used for the formation of the first graphene layer and wherein the second substrate is a sacrificial substrate used for the flip transfer of at least the first and second graphene layers to a third substrate.

3. An apparatus as claimed in claim 1, wherein the lower and upper graphene layers are planar.

4. An apparatus as claimed in claim 1, wherein the first graphene layer and/or the second graphene layer is/are doped.

5. An apparatus as claimed in claim 1, wherein the first graphene layer and the second graphene layer are differentially doped.

6. An apparatus as claimed in claim 1, wherein at least one of the first graphene layer and the second grapheme layer is differentially doped.

7. An apparatus comprising:
   a stacked structure comprising:
   a substrate having a flat upper surface;
   a flat lower patterned layer overlying the flat upper surface of the substrate and comprising at least one patterned source/drain electrode;
   a flat lower graphene layer overlying the flat lower patterned layer;

a flat upper graphene layer overlying the flat lower graphene layer; and a flat upper patterned layer overlying the flat upper graphene layer and comprising at least one patterned source/drain electrode;

wherein the flat lower patterned layer is a planar layer having a flat upper surface adjacent the lower graphene layer;

the upper graphene layer directly contacts the lower graphene layer, or the upper graphene layer is separated from the lower graphene layer by a dielectric layer only; and the flat upper graphene layer is rotated with respect to the flat lower graphene layer by an angle that is not a multiple of 60 degrees.

8. An apparatus as claimed in claim 7, wherein the flat lower patterned layer has a flat lower surface adjacent the flat upper surface of the substrate.

9. An apparatus as claimed in claim 7, wherein the flat lower patterned layer comprises at least one patterned gate electrode associated with the lower graphene layer.

10. An apparatus as claimed in claim 9, wherein the flat lower patterned layer comprises a dielectric layer between the at least one patterned gate electrode and the lower graphene layer.

11. An apparatus as claimed in claim 7, wherein the flat upper patterned layer is a planar layer having a flat upper surface and a flat lower surface adjacent the flat upper graphene layer.

12. An apparatus as claimed in claim 7, comprised in a transistor having a top gate formed by the flat upper patterned layer and a bottom gate formed by the flat lower patterned layer.

13. An apparatus as claimed in claim 1, wherein the flat first graphene layer and the flat second graphene layer are adhered together.

14. An apparatus as claimed in claim 13, wherein the flat first graphene layer and the flat second graphene layer are adhered together, at least in part, by Van der Waals forces.

15. An apparatus as claimed in claim 9, wherein the flat upper patterned layer comprises at least one patterned gate electrode associated with the upper graphene layer.

16. An apparatus as claimed in claim 7, wherein the upper graphene layer directly contacts the lower graphene layer.

* * * * *